United States Patent [19]

Chen et al.

[11] Patent Number: 5,732,016

[45] Date of Patent: Mar. 24, 1998

[54] MEMORY CELL STRUCTURE IN A MAGNETIC RANDOM ACCESS MEMORY AND A METHOD FOR FABRICATING THEREOF

[75] Inventors: Eugene Chen, Gilbert; Saied N. Tehrani; Herbert Goronkin, both of Tempe, all of Ariz.

[73] Assignee: Motorola, Schaumburg, Ill.

[21] Appl. No.: 674,387

[22] Filed: Jul. 2, 1996

[51] Int. Cl.$^6$ ................................. G11C 11/00
[52] U.S. Cl. ................ 365/158; 365/171; 365/97
[58] Field of Search ................ 365/171, 97, 158; 360/113

[56] References Cited

U.S. PATENT DOCUMENTS

| | | | |
|---|---|---|---|
| 4,455,626 | 6/1984 | Lutes | 365/158 |
| 5,396,455 | 3/1995 | Brady et al. | 365/97 |
| 5,448,515 | 9/1995 | Fukami et al. | 365/171 |
| 5,587,943 | 12/1996 | Torok et al. | 365/158 |
| 5,640,343 | 6/1997 | Gallagher et al. | 365/171 |

Primary Examiner—David C. Nelms
Assistant Examiner—Hoai V. Ho
Attorney, Agent, or Firm—Eugene A. Parsons

[57] ABSTRACT

A magnetic random access memory (MRAM) cell structure (10) with a portion of giant magnetoresistive (GMR) material (11), around which single or multiple word line (12) is wound, is provided. Magnetic field generated by word current (13, 14) superimposed in portion of GMR material (11) so that a total strength of magnetic field increases proportionally. The same word current is passed through the portion of GMR material (11) multiple times, thus producing equivalent word field by many times as large word current in a conventional MRAM cell.

18 Claims, 7 Drawing Sheets

MEMORY CELL STRUCTURE IN A MAGNETIC RANDOM ACCESS MEMORY AND A METHOD FOR FABRICATING THEREOF

FIELD OF THE INVENTION

The present invention relates to a random access memory cell structure in a magnetic random access memory and its fabrication method, and more particularly, to a memory cell structure with multiple use of the same word current on a portion of giant magnetoresistive memory element and its fabrication method.

BACKGROUND OF THE INVENTION

A magnetic random access memory (MRAM) is a non-volatile memory which basically includes a portion of giant magnetoresistive (GMR) material as memory element, a sense line, and a word line. The MRAM employs magnetic vector direction in GMR portion to store memory states, and GMR effect for memory readout. Magnetic vectors in the GMR material are switched very quickly from one direction to an opposite direction when a magnetic field is applied to the GMR material portion over a certain threshold. According to the direction of the magnetic vectors in the GMR material, states are stored, for example, one direction can be defined as a logic "0", and another direction can be defined as a logic "1". The GMR material maintains these states even without any magnetic field being applied. The states stored in GMR material can be read by a sense line which connects GMR portions in series. That is, the different magnetic vector directions in the GMR material cause a different voltage output in the sense line because of a different GMR portion resistance due to the direction of the magnetic vectors.

A word line is typically a single metal line which is placed on top or bottom of the GMR material. In order to alternate the states in the GMR material portion, a word current of higher than 10 mA may be required in high density MRAM. This current consumes much power and prevents MRAM from becoming a strong candidate for portable applications.

Accordingly, there is a need for a memory cell structure with reduced word current and a method for fabricating the memory cell structure.

SUMMARY OF THE INVENTION

This need and others are substantially met through provision of a memory cell structure in a magnetic random access memory including a portion of giant magnetoresistive material, and a conductor (word line), which has a first leg on one side of the portion, a second leg on another side of the portion and a connecting bight, for applying magnetic field using currents to the GMR material portion. There are dielectric layers separating the conductor and the GMR material portion.

DETAILED DESCRIPTION OF THE PREFERRED EMBODIMENTS

Figure 1:
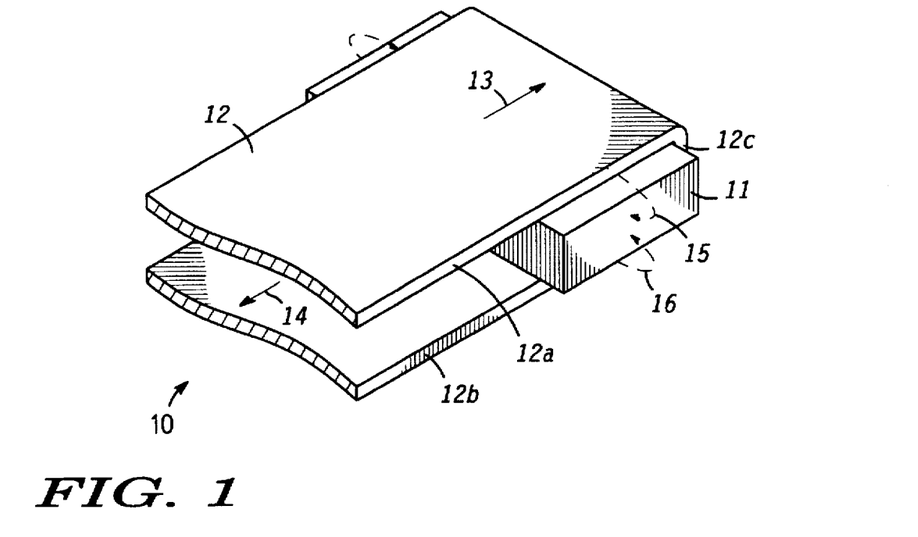
FIG. 1 is a simplified and enlarged perspective view illustrating a memory cell structure in accordance with the present invention.

FIG. 1 is a simplified and enlarged perspective view illustrating a memory cell structure in accordance with the present invention. A memory cell structure 10 includes a portion of magnetic material 11, particularly giant magnetoresistive (GMR) material, and a word line 12 which has legs 12a and 12b, and bight 12c. Memory cell structure 10 is covered with a dielectric material, which is not shown in FIG. 1. Portion of GMR material 11 can be magnetic layers such as nickel or iron or cobalt or alloys thereof separated by a non-magnetic interlayer such as Cu. Portion of GMR material 11 has typically 1.25 µm in length, 0.25 µm in width, and 100 angstrom in thickness. Word line 12 is a continuous conductor line such as aluminum or copper or alloys thereof or tungsten, each portion of which can be fabricated at different steps as explained hereinafter. Word line 12 is isolated from magnetoresistive material 11 by an insulating material.

In order to read or write the states contained in portion of GMR material 11, a word current and a sense current are provided and the MRAM cell crossed by word line 12 and a sense line (not shown) are selected. A word current represented by arrows 13 and 14 generates magnetic fields 15 and 16, respectively. Magnetic fields 15 and 16 are superimposed in portion of GMR material 11 so that a total magnetic field therein increases nearly twice as strong as one in the prior art magnetic cell. If the same strength of magnetic field is required in portion of GMR material 11, a half amount of current may be enough to read and write the states in portion of GMR material 11, comparing to a word current of the prior art.

Figure 2:
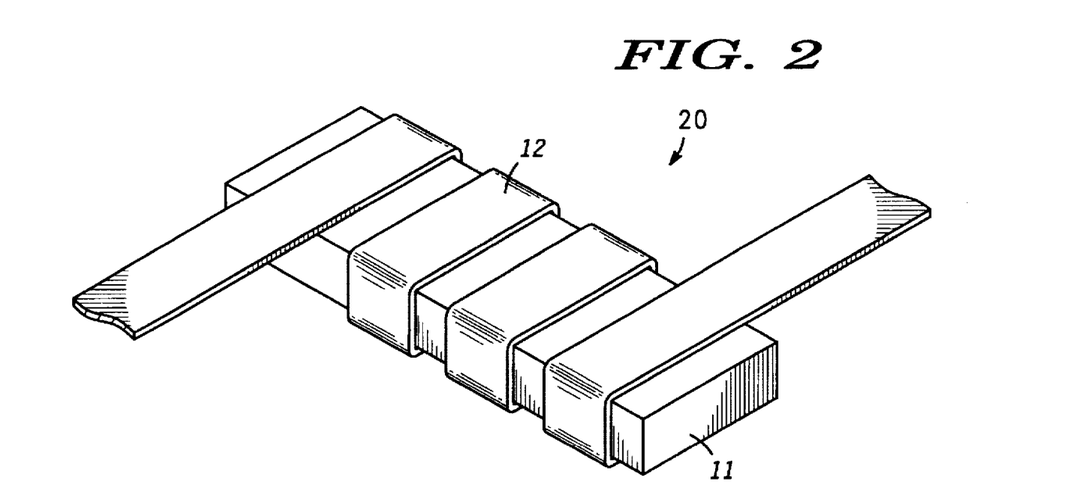
FIG. 2 is a simplified and enlarged perspective view illustrating another memory cell structure in accordance with the present invention.

FIG. 2 is a simplified and enlarged perspective view illustrating another memory cell structure in accordance with the present invention. Portions of the following drawings that have the same reference numbers as FIG. 1 are the same as the corresponding FIG. 1 elements. A memory cell structure 20 features word line 12 wound more than once around single portion of GMR material 11. Memory cell structure 20 is covered with a dielectric material, which is not shown in FIG. 2. The strength of the magnetic field in portion of GMR material 11 increases approximately in proportion to the number of windings of word line 12 in which the word current flows. Therefore, memory cell structure 20 can equivalently reduce the amount of current flow in word line 12 and also the power consumption. This is achieved through flowing the same word current around the GMR portion multiple times. Word line 12 and memory cell 11 are separated by a dielectric material.

Figure 3:
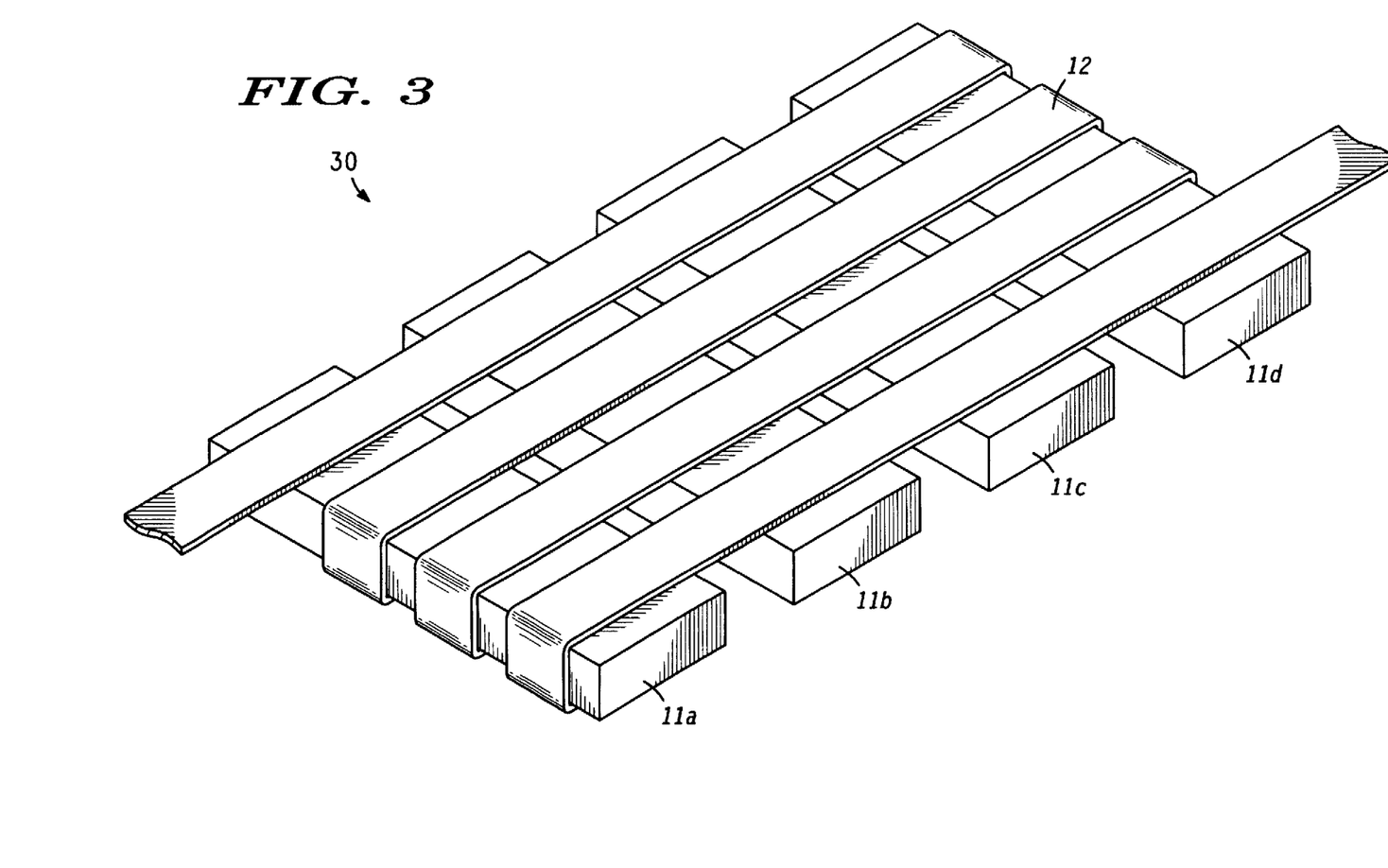
FIG. 3 is a simplified and enlarged perspective view illustrating another memory cell structure having a plurality of portions of GMR material in accordance with the present invention.

FIG. 3 is a simplified and enlarged perspective view illustrating still another memory cell structure having a plurality of portions of GMR material. A memory cell structure 30 has a plurality of portions of GMR material 11a, 11b, 11c, and 11d, which are the same as the one shown in FIG. 2, around a bunch of which word line 12 is wound. Memory cell structure 30 is covered with a dielectric material, which is not shown in FIG. 3. FIG. 3 shows a plurality of portions of GMR material 11a–11d placed on the same plane, however word line 12 may wind around stacked portions of GMR material. Magnetic fields generated by word current flow in word line 12 are superimposed so that the strength of the magnetic field in portion of GMR material 11 increases approximately in proportion of the number of windings of word line 12. Therefore, memory cell structure 30 can reduce the amount of word current, while less vertical connections of word line 12 between portions of GMR material 11a–11d makes it easier to fabricate memory cell structure 30. Further, less vertical connections of word line 12 can achieve higher memory cell density.

Figure 4:
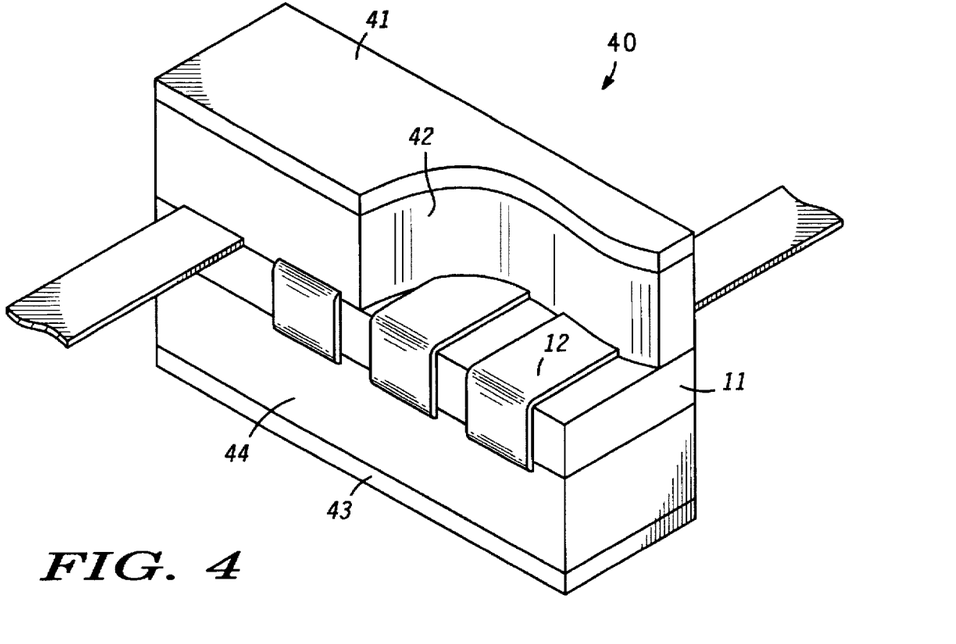
FIG. 4 is a simplified and enlarged perspective view illustrating another memory cell structure with flux concentrators in accordance with the present invention.

FIG. 4 is a simplified and enlarged perspective view illustrating a cell structure with flux concentrators. A memory cell structure 40 has two flux concentrators 41 and 43 separated by dielectric layers 42 and 44 on portion of GMR material 11 around which word line 12 is wound. Flux concentrators 41 and 43 are formed of a magnetic material having high permeability such as permalloy. Magnetic flux generated by the word current in word line 12 is concentrated and magnified in portion of GMR material 11 because of the high permeability of concentrations 41 and 43, therefore flux concentrators result in even less word current and power consumption. Alternatively, flux concentrators 41 and 43 may be formed as a part of word line 12 and the structure is similar to FIG. 2.

Figure 5:
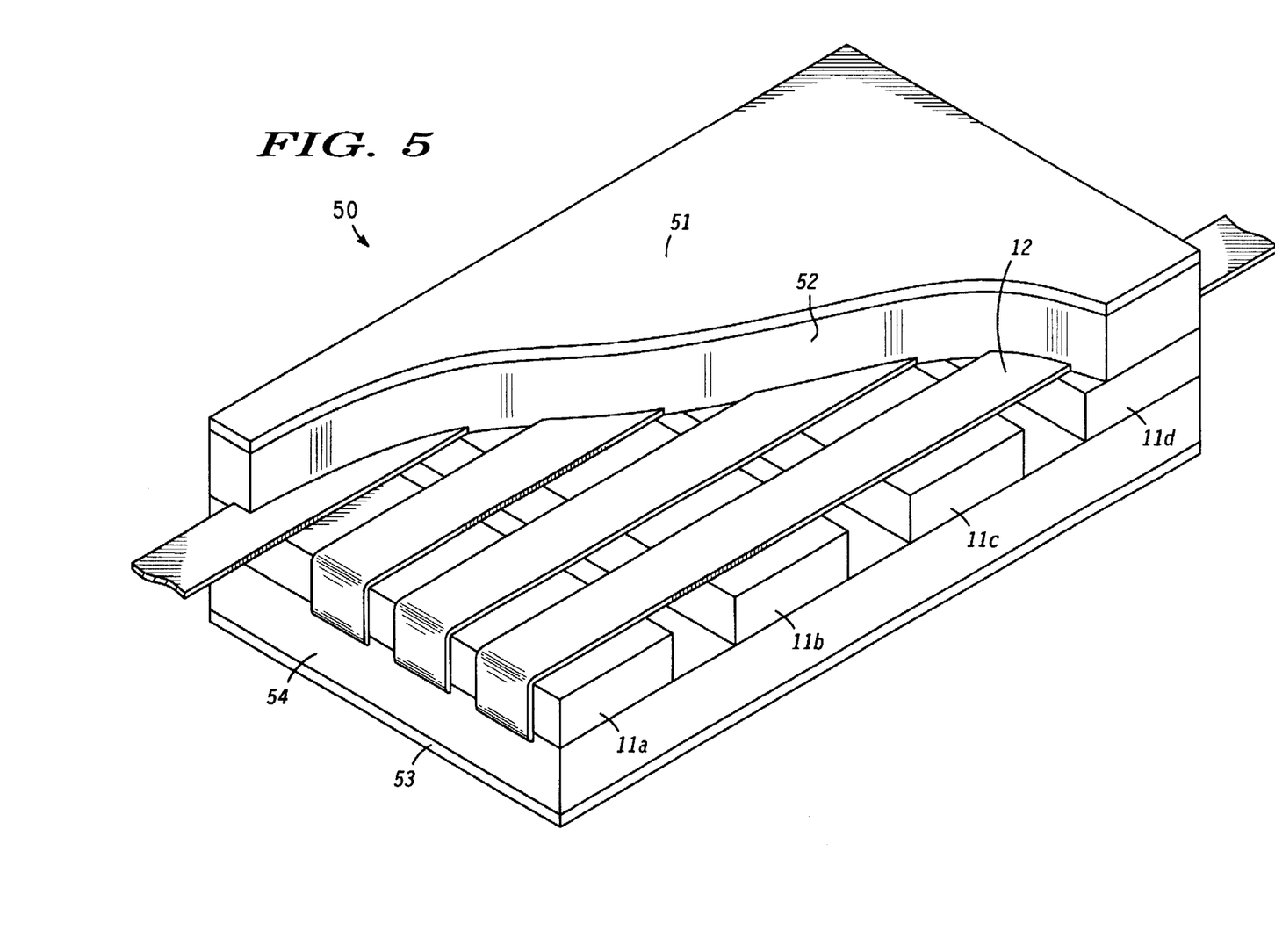
FIG. 5 is a simplified and enlarged perspective view illustrating still another memory cell structure with flux concentrators in accordance with the present invention.

FIG. 5 is a simplified and enlarged perspective view illustrating another memory cell structure with flux concentrators. A memory cell structure 50 has two flux concentrators 51 and 53 separated by dielectric layers 52 and 54 on a plurality of portions of GMR material 11a–11d around which word line 12 is wound. Flux concentrators 51 and 53 are formed of a magnetic material having high permeability such as permalloy. Flux concentrators 51 and 53, which could be on the top of word metal and connected to it, concentrate therein magnetic flux generated by the word current flow in word line 12, and magnetic flux is strengthened in each portion of GMR material 11a–11d. Therefore, memory cell structure 50 can achieve higher magnetic field in portions of GMR material 11a–11d than a structure without flux concentrators so that much less word current is required to alternate the states in memory cell structure 50. Further, memory cell structure 50 accomplishes higher memory cell density and simpler memory cell fabrication process because less vertical connections of word line 12 between portions of GMR material 11a–11d are required as well as the structure in FIG. 3. Alternatively, flux concentrators 51 and 53 may be formed as a part of word line 12 and the structure is similar to FIG. 3.

Figure 6:
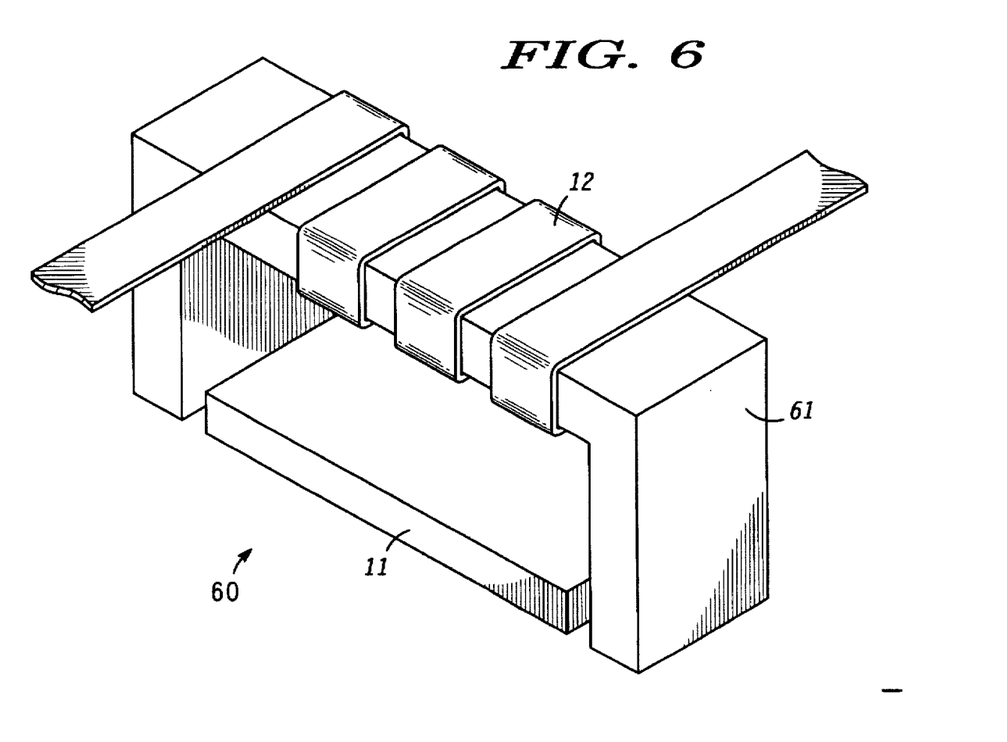
FIG. 6 is a simplified and enlarged perspective view illustrating a memory cell structure having a single flux concentrator wound by the word line in accordance with the present invention.

FIG. 6 is a simplified and enlarged perspective view illustrating a memory cell structure having a single flux concentrator wound by a word line. A memory cell structure 60 has flux concentrator 61 wound by word line 12 and a portion of GMR material 11 which is placed between both ends of flux concentrator 61 through gaps between flux concentrator 61 and portion of GMR material 11. Flux concentrator 61 and portion of GMR material 11 are covered with dielectric material, which is not shown in FIG. 6. Concentrator 61, typically permalloy, concentrates therein magnetic flux generated by the word current flowing in word line 12. Memory cell structure 60 features that word line 12 is wound around concentrator 61 different from the previous embodiment that word line 12 winds around portion of GMR material 11. Therefore, memory cell structure 60 requires less word current because of more concentrated magnetic field in portion of GMR material 11.

Figure 7:
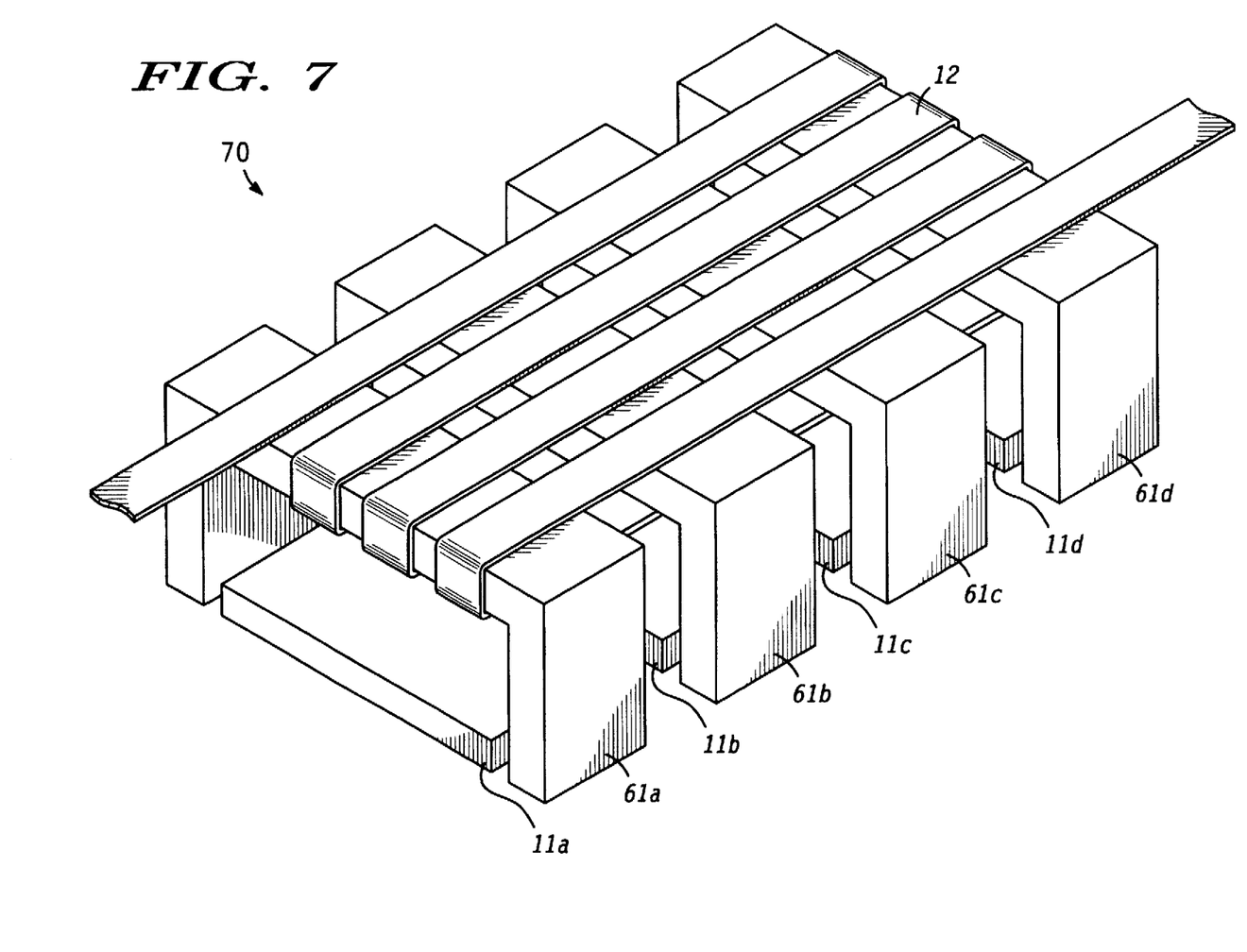
FIG. 7 is a simplified and enlarged perspective view illustrating a memory cell structure having a plurality of flux concentrators wound by the word line in accordance with the present invention.

FIG. 7 is a simplified and enlarged perspective view illustrating another memory cell structure having a plurality of flux concentrators wound by the word line. A memory cell structure 70 has a plurality of flux concentrators 61a–61d wound by word line 12 and a plurality of portions of GMR material 11a–11d. Flux concentrators 61a–61d and portions of GMR material 11a–11d are covered with dielectric material, which is not shown in FIG. 7. Each portion of GMR material 11a–11d is placed between ends of concentrators 61a–61d, respectively. Concentrators 61a–61d concentrate therein magnetic flux generated by the word current in word line 12. Then the magnetic flux is directed to portions of GMR material 11a–11d in order to alternate the states in one of portions of GMR material 11a–11d designated by a sense line (not shown). Only the concentration of word field and sense field can alternate states. Memory cell structure 70 is characterized by a plurality of flux concentrators 61a–61d wound by word line 12 and less vertical connection of word line 12 between portions of flux concentrators 61a–61d so that memory cell structure 70 has an advantage of easier fabrication and higher memory cell density thereof.

Figure 8:
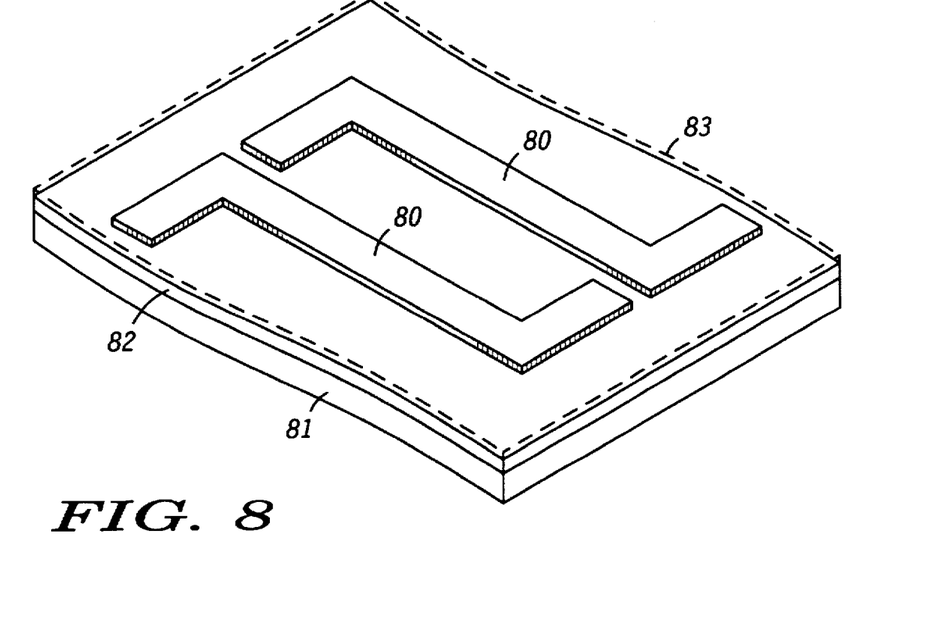
FIGS. 8–11 are simplified and enlarged perspective views illustrating several sequential steps in a method of fabricating a memory cell structure incorporating the present invention.

Next, a fabrication process for the MRAM cell structure is explained hereinafter. FIGS. 8–11 are simplified and enlarged perspective views illustrating several sequential steps in a method of fabricating a memory cell structure incorporating the present invention. Referring specifically to FIG. 8, a lower word line 80 is formed. A substrate 81 of any convenient material is provided, which is generally silicon. Silicon dioxide ($SiO_2$) or silicon nitride ($Si_3N_4$) layer 82 is grown on a silicon substrate 81. Then, lower word line 80, which is aluminum (Al), copper (Cu), or alloy thereof ($Al_{1-x}Cu_x$) or tungsten (W), is deposited and patterned on layer 82 before a dielectric layer 83 is covered on layer 82 and lower word line 80 by chemical vapor deposition techniques (CVD) to insulate from other elements.

Figure 9:
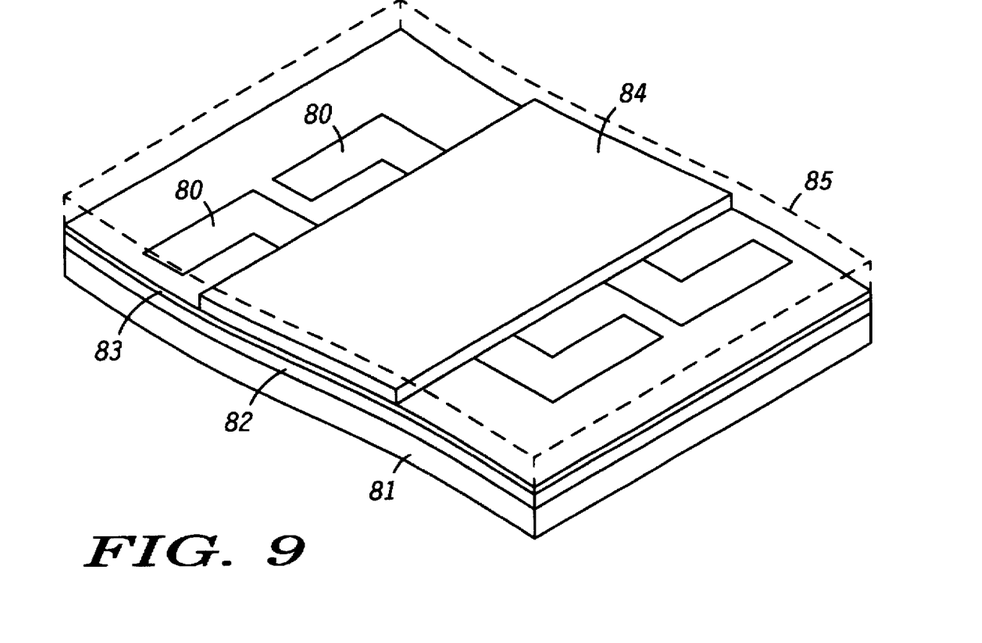

Referring to FIG. 9, portion of GMR material 84 is formed across lower word line 80 on dielectric layer 83. Portion of GMR material 84 is formed by a sputtering method followed with lithography masking and etching. After forming portion of GMR material 84, dielectric layer 85 is deposited to cover lower word line 80 and portion of GMR material 84 by CVD.

Figure 10:
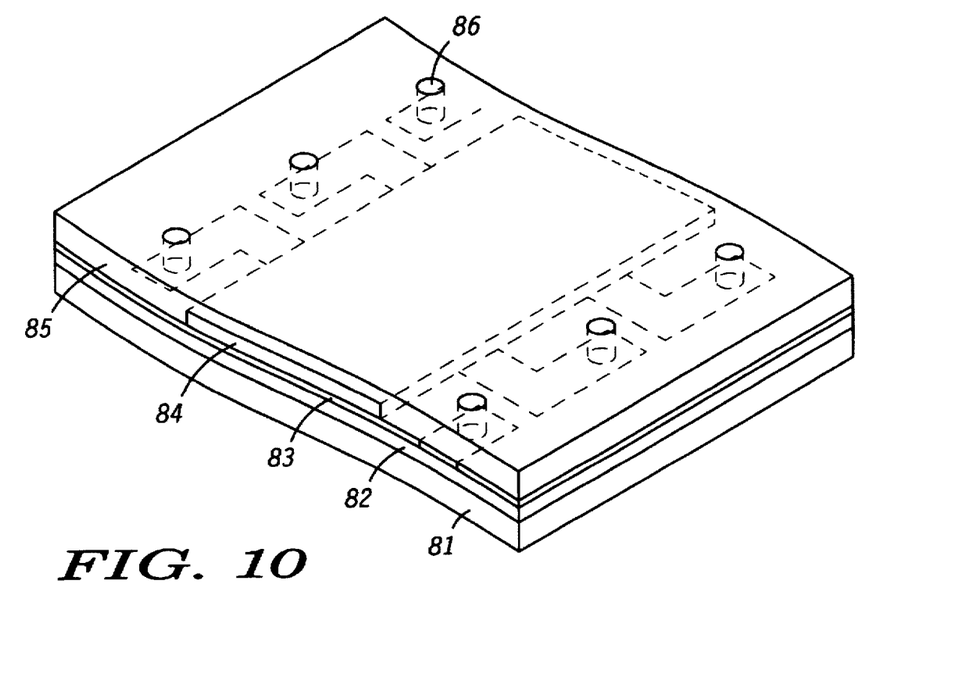

Referring to FIG. 10, contact holes (or vias) 86 contacting lower word line 80 are formed. First of all, an etch mask is patterned on the upper surface of dielectric layer 85 using a photolithography technique. Then, contact holes 86 are vertically etched to lower word line 80 by a conventional reactive ion etch technique. In this etch step, any common etching process can be utilized, including chemically assisted ion beam etching, or the like. Once contact holes 86 are formed and etch mask is removed, a conductive metal, including for example aluminum (Al), or copper (Cu) or alloy thereof, or tungsten (W), is filled in contact holes 86 which forms an ohmic contact with lower word line 80 through a metal deposition, and a chemical and mechanical polish to remove metal everywhere except in contact vias.

Figure 11:
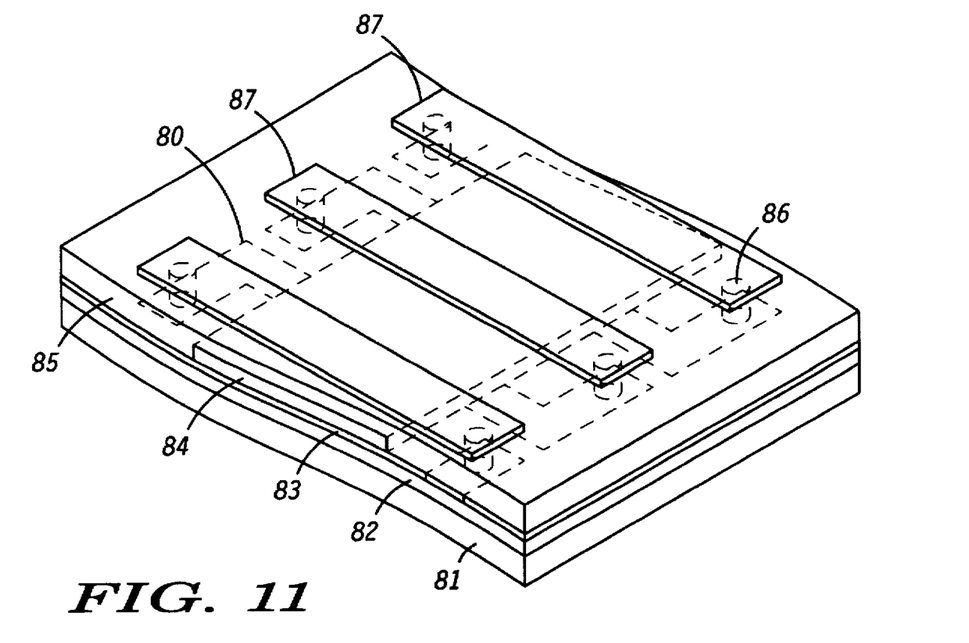

Referring to FIG. 11, upper word line 87 is formed on dielectric layer 85 and contact holes 86. Upper word line 87, which utilizes the same metal as lower word line 80, is deposited, patterned and forms ohmic contact with the metal filled in contact holes 86 so that lower word line 80 is connected with upper word line 87 in series via contact holes 86.

Thus, a fabrication process for the typical MRAM cell structure is disclosed. Further, it will be well understood by a person skilled in the art that a MRAM cell structure with flux concentrators can be fabricated by adding processes for forming flux concentrators before depositing lower word line 80 and after depositing upper word line 87.

We claim:

1. A memory cell structure in a magnetic random access memory comprising:

a portion of magnetic material; and a conductor, which has a first leg on one side of the portion, a second leg on another side of the portion and a connecting bight, for applying magnetic field to the portion.

2. The memory cell structure in said magnetic random access memory of claim 1 wherein the magnetic material includes giant magnetoresistive material.

3. The memory cell structure in said magnetic random access memory of claim 1 wherein the conductor further includes a conductor portion wound around the portion of magnetic material.

4. The memory cell structure in said magnetic random access memory of claim 1 wherein the portion of magnetic material further includes a plurality of the portions of magnetic material.

5. The memory cell structure in said magnetic random access memory of claim 4 wherein the plurality of the portions of magnetic material are arranged on the same plane.

6. The memory cell structure in said magnetic random access memory of claim 4 wherein the conductor further includes a conductor portion wound around the portion of magnetic material.

7. The memory cell structure in said magnetic random access memory of claim 6 wherein the plurality of the portions of magnetic material are arranged on the same plane.

8. The memory cell structure in said magnetic random access memory, of claim 1 further including a flux concentrators placed near the conductor on opposite side of portion of magnetic material, for concentrating magnetic flux to the portion of magnetic material.

9. The memory cell structure in said magnetic random access memory of claim 8 further including a dielectric layer inserted between the flux concentrator and the portion of magnetic material.

10. The memory cell structure in said magnetic random access memory of claim 3 further including flux concentrators, placed near the conductor on opposite side of portion of magnetic material.

11. The memory cell structure in said magnetic random access memory of claim 10 further including a dielectric layer inserted between the flux concentrator and the portion of magnetic material.

12. The memory cell structure in said magnetic random access memory of claim 7 further including flux concentrators, placed near the conductor on opposite side of portion of magnetic material.

13. The memory cell structure in said magnetic random access memory of claim 12 further including a dielectric layer inserted between the flux concentrator and the portion of magnetic material.

14. A memory cell structure in said magnetic random access memory comprising:

a flux concentrator for concentrating magnetic flux;

a conductor having a first leg on one side of the flux concentrator, a second leg on another side of the flux concentrator and a connecting bight; and a portion of magnetic material magnetically coupled to the flux concentrator.

15. The memory cell structure in said magnetic random access memory of claim 14 wherein the conductor further includes a conductor portion wound around the flux concentrator.

16. The memory cell structure in said magnetic random access memory of claim 14 wherein the flux concentrator further includes a plurality of the flux concentrator.

17. The memory cell structure in said magnetic random access memory of claim 16 wherein the plurality of the flux concentrators are arranged on the same plane.

18. The memory cell structure in said magnetic random access memory of claim 17 wherein the conductor further includes a conductor portion wound around the flux concentrator.

* * * * *

UNITED STATES PATENT AND TRADEMARK OFFICE
CERTIFICATE OF CORRECTION

PATENT NO. : 5,732,016
DATED : March 24, 1998
INVENTOR(S) : Chen et al.

It is certified that error appears in the above-identified patent and that said Letters Patent is hereby corrected as shown below:

Column 1,
Line 5, after the Title, please add as a new first paragraph the following paragraph:
   -- This invention was made with Government support under Agreement No. MDA972-96-3-0016 awarded by DARPA. The Government has certain rights in the invention. --

Signed and Sealed this

Nineteenth Day of August, 2003

JAMES E. ROGAN
*Director of the United States Patent and Trademark Office*